US009060413B2

(12) United States Patent
Abe

(10) Patent No.: US 9,060,413 B2
(45) Date of Patent: Jun. 16, 2015

(54) INSTALLATION POSTURE ADJUSTABLE LEG BODY AND ELECTRONIC DEVICE INCLUDING THE SAME

(71) Applicant: JVC KENWOOD Corporation, Yokohama-shi (JP)

(72) Inventor: Kenji Abe, Tokyo (JP)

(73) Assignee: JVC KENWOOD CORPORATION (JP)

( * ) Notice: Subject to any disclaimer, the term of this patent is extended or adjusted under 35 U.S.C. 154(b) by 275 days.

(21) Appl. No.: 13/862,700

(22) Filed: Apr. 15, 2013

(65) Prior Publication Data

US 2013/0301193 A1   Nov. 14, 2013

(30) Foreign Application Priority Data

May 14, 2012 (JP) .................. 2012-110316

(51) Int. Cl.
*H05K 7/00* (2006.01)
*H05K 5/02* (2006.01)

(52) U.S. Cl.
CPC ................ *H05K 7/00* (2013.01); *H05K 5/0234* (2013.01)

(58) Field of Classification Search
CPC .............................. H05K 7/00; H05K 5/0234
USPC ................... 361/679.01, 728–747, 752–759, 361/796–802, 805–837
See application file for complete search history.

(56) References Cited

U.S. PATENT DOCUMENTS

| 5,154,265 | A | * | 10/1992 | Capistrant ................... 190/18 A |
| 5,297,003 | A | * | 3/1994 | Nomura et al. .......... 361/679.12 |
| 6,594,856 | B1 | * | 7/2003 | Cherukuri ........................ 16/34 |
| 7,566,043 | B2 | * | 7/2009 | Chen .............................. 248/616 |
| 8,141,885 | B2 | * | 3/2012 | Fan et al. ......................... 280/30 |
| 8,579,393 | B2 | * | 11/2013 | Song et al. ................. 312/351.9 |
| 8,767,395 | B2 | * | 7/2014 | Yoo ........................... 361/679.56 |
| 2003/0218957 | A1 | * | 11/2003 | Tanishima ................... 369/75.1 |
| 2005/0057896 | A1 | * | 3/2005 | Homer .......................... 361/686 |
| 2008/0218948 | A1 | * | 9/2008 | Lai et al. ....................... 361/679 |
| 2009/0122280 | A1 | * | 5/2009 | Kuroda ......................... 353/119 |
| 2009/0268396 | A1 | * | 10/2009 | Tang ........................ 361/679.55 |
| 2009/0268397 | A1 | * | 10/2009 | Tang ........................ 361/679.55 |
| 2009/0268398 | A1 | * | 10/2009 | Tang ........................ 361/679.55 |
| 2009/0316353 | A1 | * | 12/2009 | Tang ........................ 361/679.55 |
| 2011/0007466 | A1 | * | 1/2011 | Wang .......................... 361/679.2 |

(Continued)

FOREIGN PATENT DOCUMENTS

JP   6431291   2/1989

*Primary Examiner* — Courtney Smith
*Assistant Examiner* — Rashen E Morrison
(74) *Attorney, Agent, or Firm* — Cantor Colburn LLP

(57) ABSTRACT

The installation posture adjustable leg body includes a foot fixed on a bottom surface of a case body, and a lever rotatably supported by the foot so as to selectively move to one of a sheltered state and an advanced state. The lever includes a lever main body inserted between the foot and an installation surface in the advanced state, and a rotating mechanism rotatably supporting the lever main body with respect to the foot. The lever main body includes a main body supporting surface of advanced state contacting the foot and a lever installation surface of advanced state contacting the installation surface, in the advanced state. A part of the lever installation surface of advanced state is located in a virtual pillar body using the main body supporting surface of advanced state as a bottom surface and extending perpendicular to the main body supporting surface of advanced state.

7 Claims, 17 Drawing Sheets

(56) References Cited

U.S. PATENT DOCUMENTS

| | | | |
|---|---|---|---|
| 2011/0069446 A1* | 3/2011 | Trang | 361/679.55 |
| 2011/0279792 A1* | 11/2011 | Suzuki et al. | 353/119 |
| 2012/0133261 A1* | 5/2012 | Yuan et al. | 312/334.1 |
| 2013/0037546 A1* | 2/2013 | Shih | 220/476 |

* cited by examiner

INSTALLATION POSTURE ADJUSTABLE LEG BODY AND ELECTRONIC DEVICE INCLUDING THE SAME

CROSS-REFERENCE TO RELATED PATENT APPLICATIONS

This application claims the benefit of Japanese Patent Application No. 2012-110316, filed on May 14, 2012, in the Japan Patent Office, the disclosure of which is incorporated herein in its entirety by reference.

BACKGROUND OF THE INVENTION

1. Field of the Invention

The present invention relates to an installation posture adjustable leg body and an electronic device including the installation posture adjustable leg body.

2. Description of the Related Art

Patent Document 1 discloses a height adjustable leg, in which a foldable leg that is supported pivotably at two locations, that is, a stand location and a folding location, is mounted on a stand main body that is attached to a lower surface of a case body of an electronic device, etc. When the foldable leg is rotated to the stand location, the case body is inclined.

According to Patent Document 1 when the foldable leg is rotated to the stand location so that the case body may be inclined, a weight of the case body is applied to an axis of the foldable leg, and accordingly, the axis of the foldable leg may be damaged according to the weight of the case body.

Patent Document 1

Japanese Laid-open Utility Model Publication No. Sho 64-31291

SUMMARY OF THE INVENTION

The present invention provides a technology for hardly damaging an installation posture adjustable leg body.

According to an aspect of the present invention, there is provided an installation posture adjustable leg body for adjusting an installation posture of a case body on an installation surface, the installation posture adjustable leg body including: a leg main body which is fixed on a bottom surface of the case body; and a movable unit which is rotatably supported by the leg main body so as to selectively move to one of a sheltered state, in which the leg main body is located at a first location, and an advanced state, in which the leg main body is located at a second location that is at a higher level than that of the first location, wherein the movable unit includes: a movable unit main body which is inserted between the leg main body and the installation surface in the advanced state; and a rotating mechanism which rotatably supports the movable unit main body with respect to the leg main body, and the movable main body includes a first support surface contacting the leg main body in the advanced state, and a second support surface contacting the installation surface in the advanced state, wherein at least a part of the second support surface is located in a virtual pillar body using the first support surface as a bottom surface and extending in a direction perpendicular to the first support surface.

According to another aspect of the present invention, there is provided an electronic device including: a case body; and the installation posture adjustable leg body attached to a bottom surface of the case body, wherein a curved surface of a leg main body and a curved surface of a movable unit main body may are located at a front surface side of the case body, in the advanced state.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

First Embodiment

Hereinafter, a first embodiment of the present invention will be described below with reference to FIGS. 1 through 13.

Figure 1:
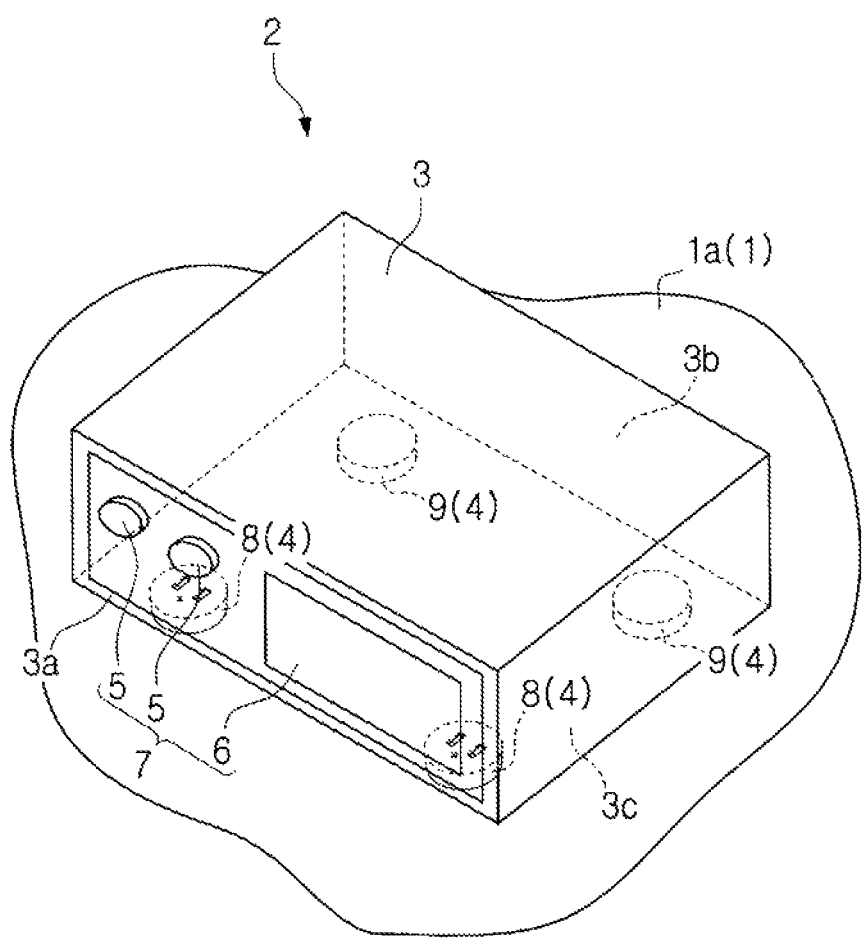
FIG. 1 is a perspective view of an electronic device mounted on an installation board (first embodiment)

FIG. 1 is a diagram showing an electronic device 2 mounted on an installation surface 1a of a universal rack 1. The electronic device 2 includes a case body 3 and four leg bodies 4.

The case body 3 is formed approximately in a rectangular parallelepiped shape. The case body 3 includes, at least, a front surface 3a, a back surface 3b, and a bottom surface 3c. A manipulation panel 7 including a plurality of buttons 5 or a display 6 is formed on the front surface 3a. The four leg bodies 4 are attached to the bottom surface 3c of the case body 3. The four leg bodies 4 include two adjustable leg bodies 8 (installation posture adjustable leg bodies) and two fixed leg bodies 9. The two adjustable leg bodies 8 are disposed at the front surface 3a side of the bottom surface 3c of the case body 3. The two fixed leg bodies 9 are disposed at the back surface 3b side of the bottom surface 3c of the case body 3.

The two adjustable leg bodies 8 have different functions and structures from those of the two fixed leg bodies 9. The two adjustable leg bodies 8 adjust an installation posture of the case body 3 on the installation surface 1a when the case body 3 is mounted on the installation surface 1a. That is, an installation posture of the case body 3 on the installation surface 1a is adjusted by using the two adjustable leg bodies 8 so as to adjust a direction in which the manipulation panel 7 is oriented, and accordingly, a manipulation property of the manipulation panel 7 may be improved. In the present embodiment, the two adjustable leg bodies 8 are suitable for, in particular, a high price electronic device 2 which has a weight of, for example, 15 kg to 20 kg and considers its design important. The two fixed leg bodies 9 are general leg bodies having no extraordinary function.

Adjustable Leg Bodies 8

Hereinafter, the two adjustable leg bodies 8 will be described below. The two adjustable leg bodies 8 have completely the same configurations as each other, and thus, only one of the two adjustable leg bodies 8 will be described below.

Figure 2:
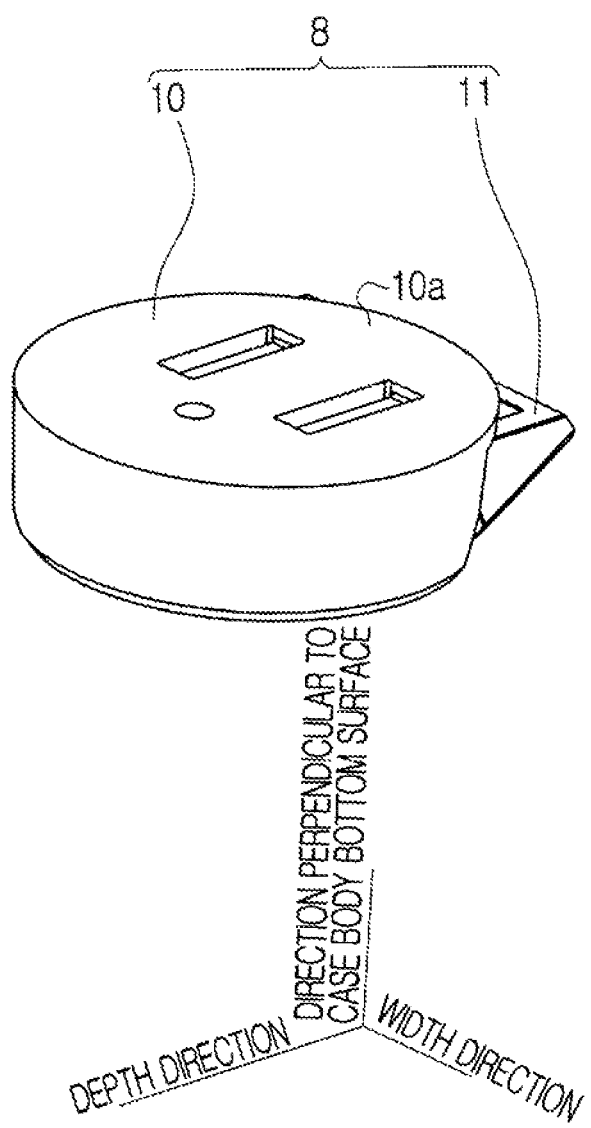
FIG. 2 is a perspective view of an adjustable leg body, a lever of which is in a sheltered state (first embodiment)
Figure 3:
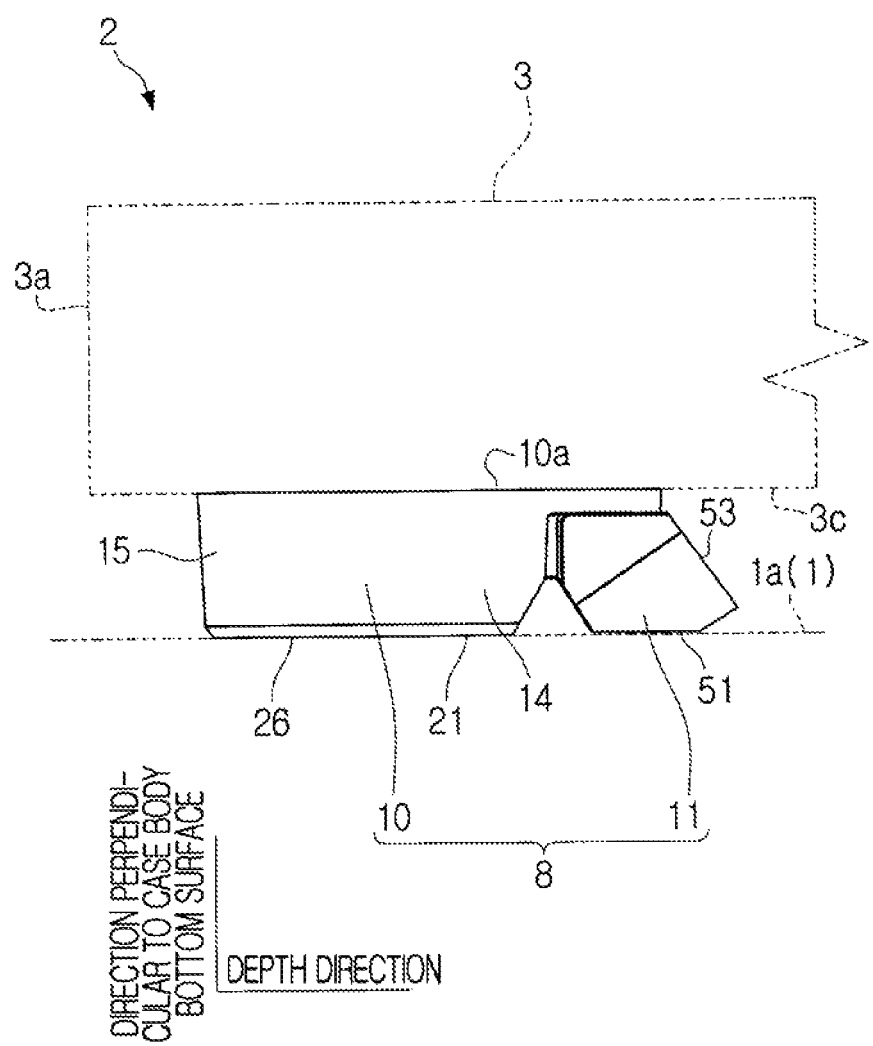
FIG. 3 is a side view of the adjustable leg body, the lever of which is in a sheltered state (first embodiment)
Figure 4:
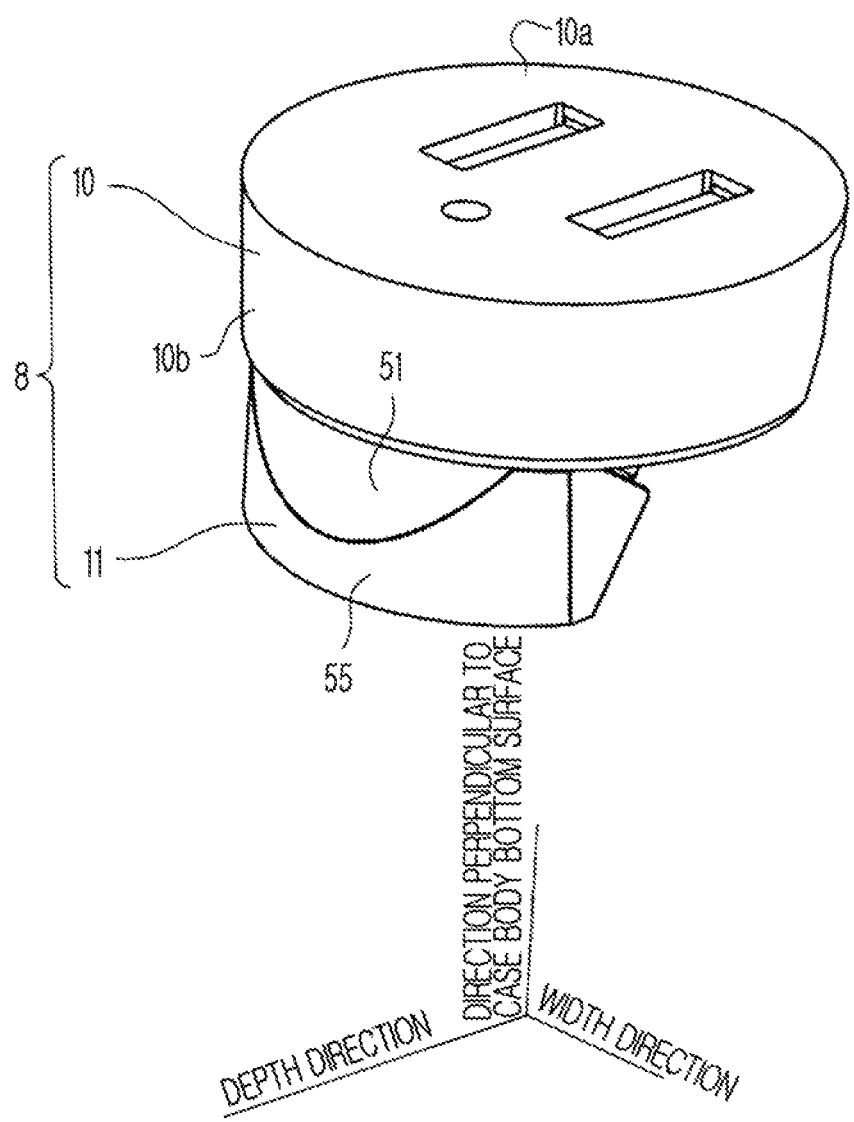
FIG. 4 is a perspective view of the adjustable leg body, the lever of which is in an advanced state (first embodiment)
Figure 5:
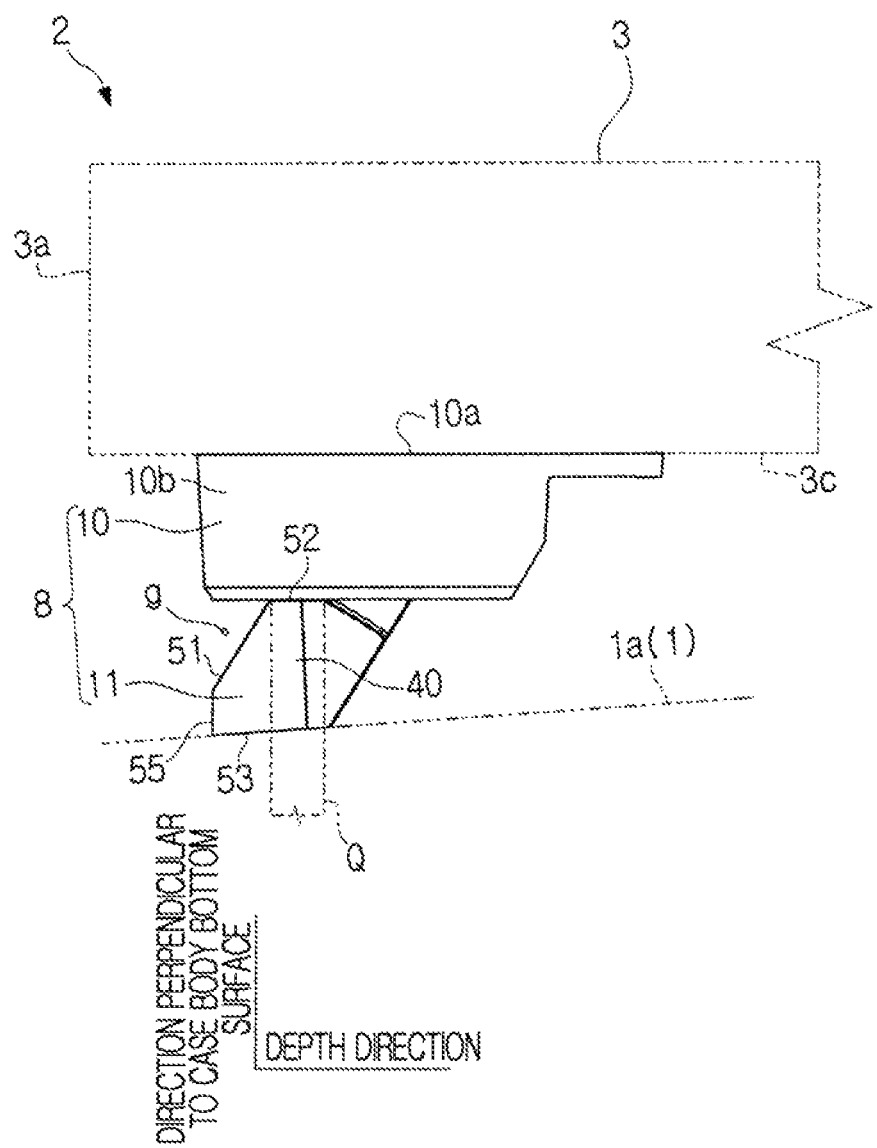
FIG. 5 is a side view of the adjustable leg body, the lever of which is in an advanced state (first embodiment)

As shown in FIGS. 2 through 5, the adjustable leg body 8 includes a foot 10 (leg main body) and a lever 11 (movable unit). As shown in FIGS. 3 and 5, the foot 10 is fixed on the bottom surface 3c of the case body 3 that is denoted by a chain double-dashed line. The lever 11 is rotatably supported by the foot 10 so as to select one of a sheltered state, in which the foot 10 is located in a first location as shown in FIG. 3, and an advanced state, in which the foot 10 is located at a second location that is at a higher level than the first location as shown in FIG. 5. That is, the lever 11 may be changed selectively to the sheltered state of FIG. 3 or the advanced state of FIG. 5. Also, a height of the foot 10 location is defined based on the installation surface 1a of the universal rack 1. As shown in FIGS. 3 and 5, the foot 10 includes a foot attaching surface 10a that faces the bottom surface 3c of the case body 3 and surface-contacts the bottom surface 3c of the case body 3.

Here, a 'direction perpendicular to a case body bottom surface', 'depth direction', and 'width direction' are defined. The direction perpendicular to the case body bottom surface, the depth direction, and the width direction are fixed with respect to the foot 10 of the adjustable leg body 8. That is, the foot 10 of the adjustable leg body 8 has the direction perpendicular to the case body bottom surface, the depth direction, and the width direction.

As shown in FIGS. 3 and 5, the direction perpendicular to the case body bottom surface is a direction perpendicular to the bottom surface 3c of the case body 3. That is, the direction perpendicular to the case body bottom surface is a direction perpendicular to the foot attaching surface 10a of the foot 10. In the direction perpendicular to the case body bottom surface, a direction in which the case body 3 is seen from the adjustable leg body 8 is referred to as a case body adjacent direction, and a direction in which the adjustable leg body 8 is seen from the case body 3 is referred to as a case body away direction. The depth direction is defined as a direction perpendicular to the front surface 3a of the case body 3 when the foot 10 of the adjustable leg body 8 is attached to the bottom surface 3c of the case body 3. In the depth direction, a direction towards the back surface 3b from the front surface 3a (refer to FIG. 1) is referred to as a rear direction, and a direction towards the front surface 3a from the back surface 3b is referred to as a front direction. The depth direction is perpendicular to the direction perpendicular to the case body bottom surface, when it is seen from a side surface of the foot 10 of the adjustable leg body 8 shown in FIGS. 3 and 5. The width direction is perpendicular to the direction perpendicular to the case body bottom surface and the depth direction. In the width direction, a direction towards a center of the foot 10 of the adjustable leg body 8 is referred to as a leg body center direction, and a direction away from the center of the foot 10 of the adjustable leg body 8 is referred to a leg body anti-center direction.

Foot 10

Figure 6:
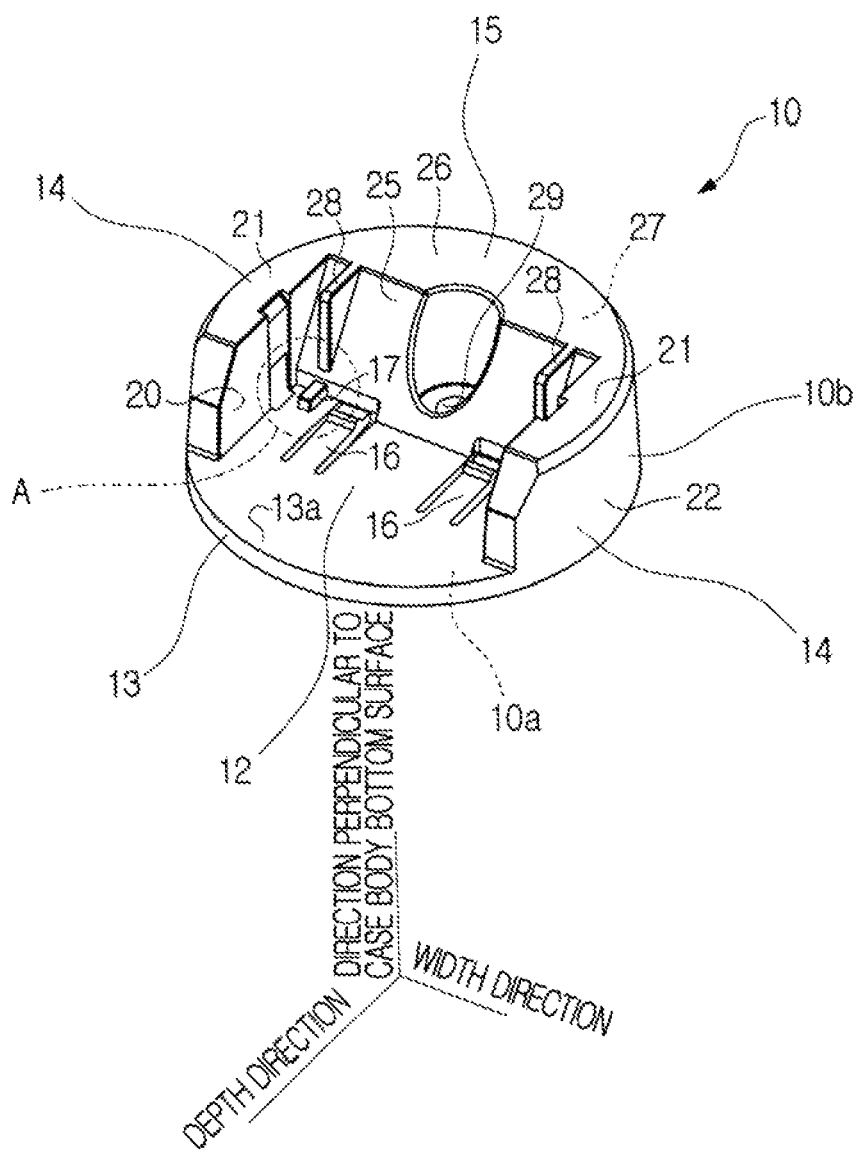
FIG. 6 is a perspective view of a foot (first embodiment)

As shown in FIG. 6, the foot 10 is formed approximately in a cylindrical shape that is partially cut. The foot 10 has an outer circumferential surface 10b (curved surface) that is curved as a loop. A lever accommodation chamber 12 is formed in the foot 10 and opens toward the rear direction and the case body away direction is formed in the foot 10. The foot 10 includes a ceiling plate 13, a pair of side plates 14, and a front portion 15. The ceiling plate 13 defines a side of the lever accommodation chamber 12 in the case body adjacent direction. The pair of side plates 14 defines sides of the lever accommodation chamber 12 in the leg body anti-center direction. The front portion 15 defines a side of the lever accommodation chamber 12 in the front direction.

Figure 7:
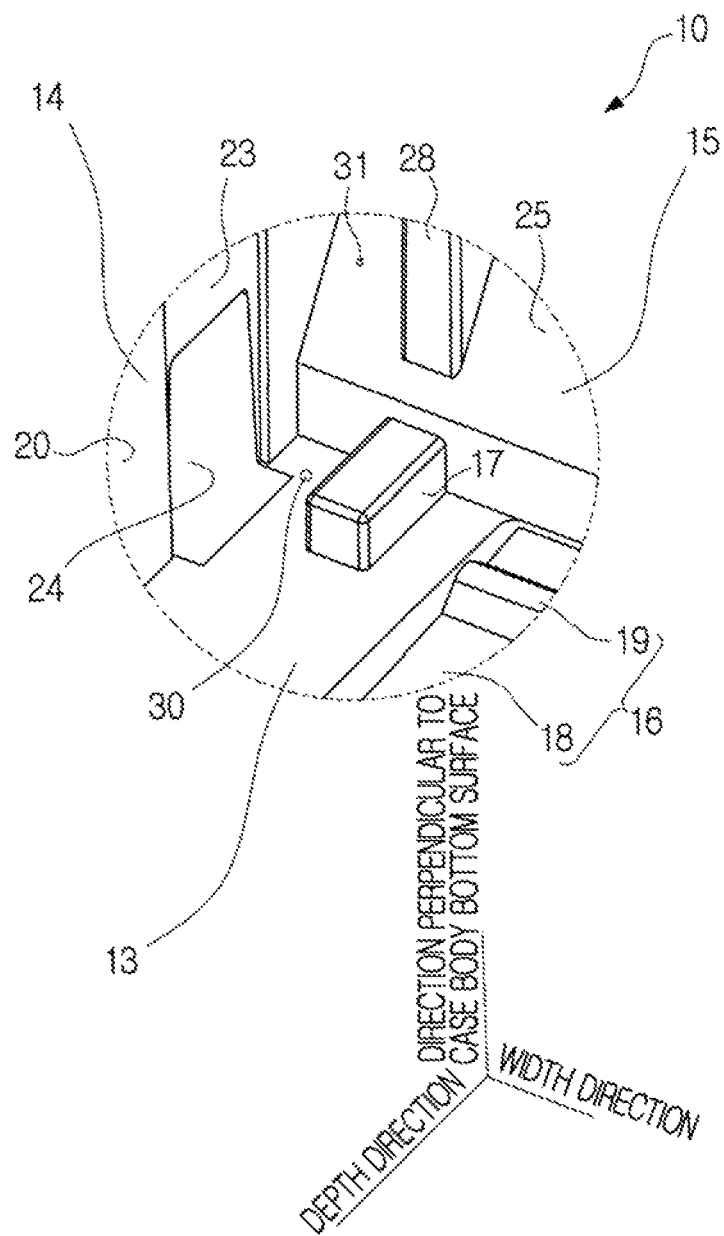
FIG. 7 is an enlarged view of a portion A shown in FIG. 6 (first embodiment)

The ceiling plate 13 is a flat plate that is perpendicular to the direction perpendicular to the case body bottom surface. The ceiling plate 13 includes a lever contact surface 13a which faces in the case body away direction. A pair of posture holding hooks 16 and a pair of first transformation prevention ribs 17 are formed on the ceiling plate 13. The pair of posture holding hooks 16 is formed to hold the posture of the lever 11 with respect to the foot 10. The pair of posture holding hooks 16 is arranged in the width direction. As shown in FIG. 7, each of the posture holding hooks 16 includes an elastic piece 18 and a claw portion 19. The elastic piece 18 is formed as a cantilever extending in the front direction. The claw portion 19 is formed around a free end of the elastic piece 18. The claw portion 19 is formed to protrude toward the case body away direction. The pair of first transformation prevention ribs 17 prevents the lever 11 from being elastically transformed in an undesired direction. Each of the first transformation prevention ribs 17 is located at further leg body center direction side from each side plate 14. Each of the first transformation prevention ribs 17 protrudes from the ceiling plate 13 in the case body away direction.

Each of the side plates 14 is connected to a leg body anti-center direction side end portion of the ceiling plate 13, and protrudes in the case body away direction. Each of the side plates 14 includes an inner wall surface 20 which faces in the leg body center direction, a leg body installation surface 21 which faces in the case body away direction, and a curved surface 22 which forms a part of the outer circumferential surface 10b of the foot 10. The inner wall surface 20 of each side plate 14 is perpendicular to the width direction. As shown in FIG. 7, a guide recess 23 and a bearing portion 24 are formed in the inner wall surface 20 of each side plate 14. The guide recess 23 extends in the direction perpendicular to the case body bottom surface in a recess shape. The bearing portion 24 is formed at an end portion in the case body adjacent direction of the guide recess 23. The bearing portion 24 is formed as a recess which opens toward the leg body center direction. The bearing portion 24 faces the first transformation prevention rib 17. The leg body installation surface 21 of each side plate 14 is a plane perpendicular to the direction perpendicular to the case body bottom surface.

The front portion 15 is connected to an end portion of the ceiling plate 13 in the front direction, and protrudes in the case body away direction. The front portion 15 includes an inner wall surface 25 which faces in the rear direction, a leg body installation surface 26 which faces in the case body away direction, and a curved surface 27 which forms a part of the outer circumferential surface 10b of the foot 10. The inner wall surface 25 of the front portion 15 is a plane inclined to be toward the case body away direction as proceeding to the front direction. A pair of second transformation prevention ribs 28 is formed in the inner wall surface 25. The pair of second transformation prevention ribs 28 prevents the lever 11 from being elastically transformed in an undesired direction. Each of the second transformation prevention ribs 28 is formed at the slightly leg body anti-center direction side. Each of the second transformation prevention ribs 28 protrudes in parallel with the inner wall surface of each side plate 14. The leg body installation surface 26 is a plane that is perpendicular to the direction perpendicular to the case body bottom surface. The leg body installation surface 26 is connected to the leg body installation surface 21 of each side plate 14, and is located on the same plane as that of the leg body installation surface 21 of each side plate 14. In addition, a screw hole 29 for fixing the foot 10 of the adjustable leg body 8 to the bottom surface 3c of the case body 3 with a screw is formed in the front portion 15.

As shown in FIG. 7, a first arm insertion recess 30 (arm portion insertion recess) is formed between each of the first transformation prevention ribs 17 and the inner wall surface 20 of each side plate 14. Likewise, a second arm insertion recess 31 (arm portion insertion recess) is formed between each of the second transformation prevention ribs 28 and the inner wall surface 20 of each side plate 14.

Lever 11

Hereinafter, the lever 11 will be described below with reference to FIGS. 8 through 13 by using the directions defined in FIGS. 2 through 5. In FIGS. 8 through 13, each of the directions is the direction of the foot 10, not the lever 11.

As shown in FIGS. 8 through 13, the lever 11 includes a lever main body 40 (movable unit body), a rotating mechanism 41 and a posture held unit 42. The lever main body 40, as shown in FIG. 5, is inserted between the foot 10 and the installation surface 1a of the universal rack 1 in an advanced state. The rotating mechanism 41 rotatably supports the lever main body 40 with respect to the foot 10. The posture held unit 42 is a portion for holding the posture of the lever 11 with respect to the foot 10.

Figure 12:
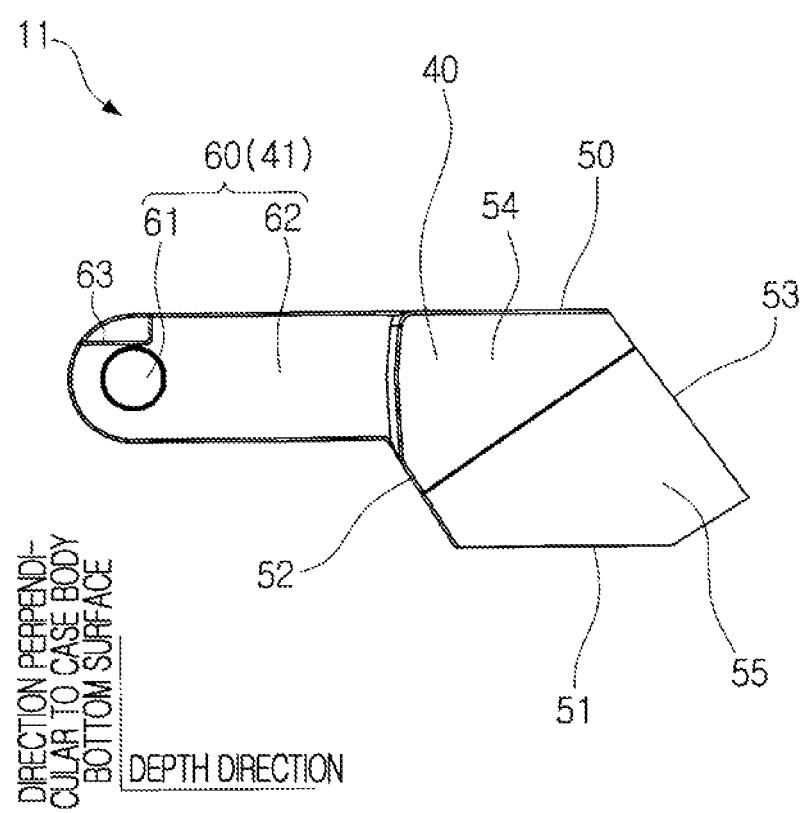
FIG. 12 is a side view of the lever in the sheltered state (first embodiment)

As shown in FIG. 12, the lever main body 40 includes a main body supporting surface of sheltered state 50, a lever installation surface of sheltered state 51 (third support surface), a main body supporting surface of advanced state 52 (first support surface), a lever installation surface of advanced state 53 (second support surface), a pair of side surfaces 54, and a curved surface 55. The main body supporting surface of sheltered state 50 is a plane that faces in the case body adjacent direction and surface-contacts the lever contact surface 13a of the ceiling plate 13 in the foot 10 shown in FIG. 6, when the lever 11 is in the sheltered state. Therefore, the main body support surface of sheltered state 50 is perpendicular to the direction perpendicular to the case body bottom surface, when the lever 11 is in the sheltered state. The sheltered lever installation surface 51 is a plane that faces in the case body away direction and faces the installation surface 1a of the universal rack 1 in parallel, as shown in FIG. 3, by interposing an elastic material, for example, a rubber cushion (not shown), therebetween, when the lever 11 is in the sheltered state. Here, as shown in FIG. 3, when the lever 11 is in the sheltered state in the present embodiment, the bottom surface 3c of the case body 3 and the installation surface 1a of the universal rack 1 are in parallel with each other. Therefore, the lever installation surface of sheltered state 11 is perpendicular to the direction perpendicular to the case body bottom surface, when the lever 11 is in the sheltered state. The main body supporting surface of advanced state 52 is a plane that surface-contacts the leg body installation surface 26 of the front portion 15 in the foot 10 shown in FIG. 6, when the lever 11 is in the advanced state. The main body supporting surface of advanced state 52 faces in a middle direction between the front direction and the case body away direction, as shown in FIG. 12, and is inclined to be toward the case body away direction as proceeding to the rear direction, when the lever 11 is in the sheltered state. The lever installation surface of advanced state 53 is a plane that surface-contacts the installation surface 1a of the universal rack 1 shown in FIG. 5, when the lever 11 is in the advanced state. The lever installation surface of advanced state 53 faces in a middle direction between the rear direction and the case body adjacent direction, as shown in FIG. 12, and is inclined to be toward the case body away direction as proceeding to the rear direction, when the lever 11 is in the sheltered state. The main body supporting surface of sheltered state 50 and the lever installation surface of sheltered state 51 are in parallel with each other. The main body supporting surface of advanced state 52 and the lever installation surface of advanced state 53 are roughly in parallel with each other. As shown in FIG. 5, the main body supporting surface of advanced state 52 and the lever installation surface of advanced state 53 are not completely in parallel with each other, but are slightly inclined toward each other, so that the lever installation surface of advanced state 53 may contact-surface the installation surface 1a of the universal rack 1 when the front surface 3a of the case body 3 faces slightly upward. The pair of side surfaces 54 is planes that face in the leg body anti-center direction and are perpendicular to the width direction. The curved surface 55 is perpendicular to the main body supporting surface of advanced state 52. The curved surface 55 has a radius of curvature that is nearly the same as that of the outer circumferential surface 10b of the foot 10.

Figure 13:
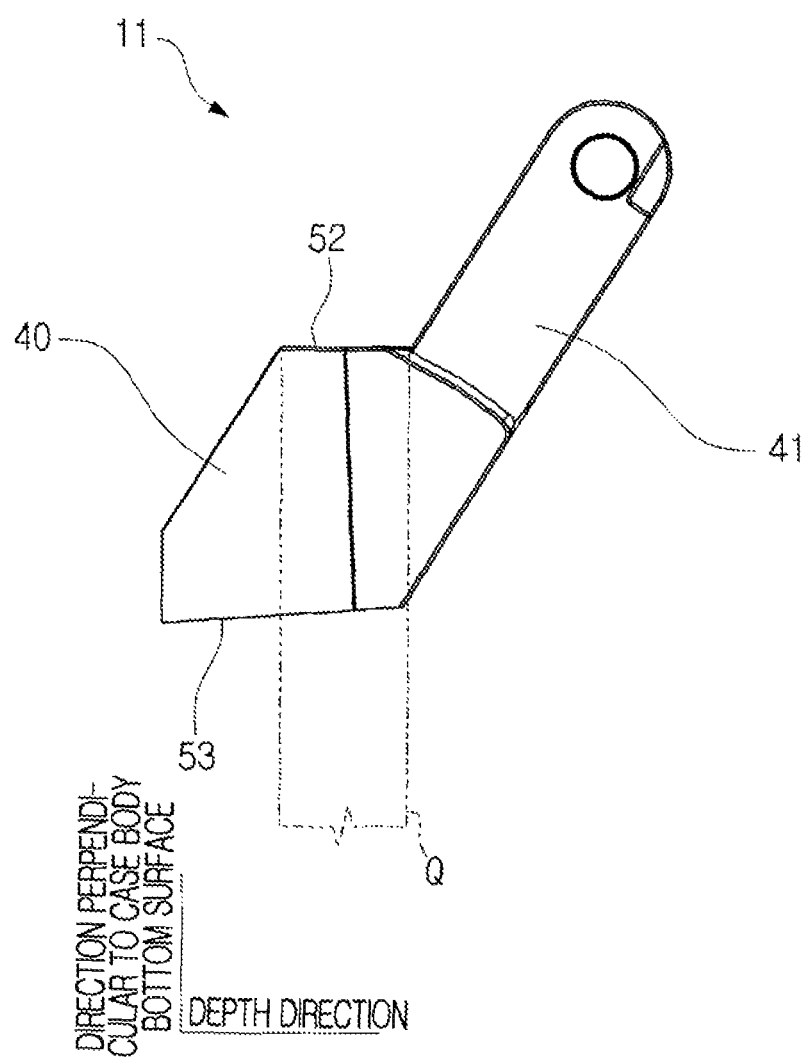
FIG. 13 is a side view of the lever in the advanced state (first embodiment)

FIG. 13 shows the advanced state of the lever 11. In the present embodiment, at least a part of the lever installation surface of advanced state 53 is located in a virtual pillar body Q that uses the main body supporting surface of advanced state 52 as a bottom surface thereof and extends in a direction perpendicular to the main body supporting surface of advanced state 52. The virtual pillar body Q extends from the main body supporting surface of advanced state 52 toward the lever main body 40.

Figure 8:
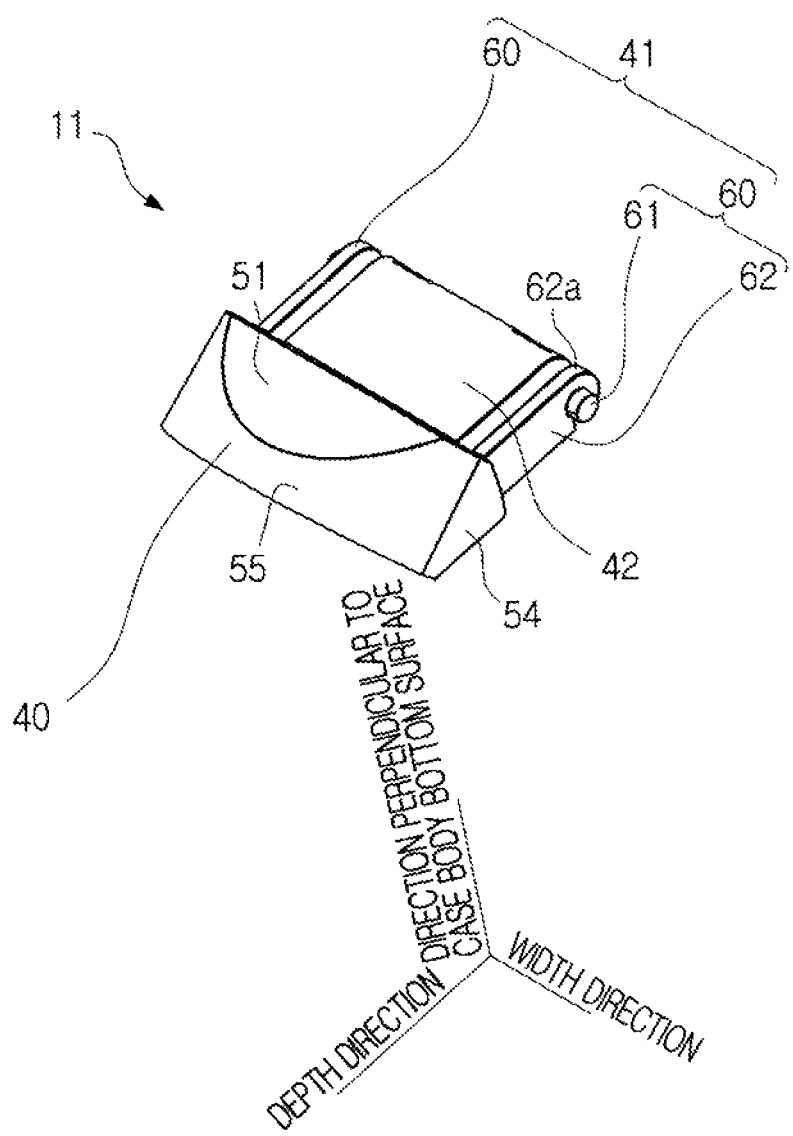
FIG. 8 is a perspective view of the lever (first embodiment)
Figure 9:
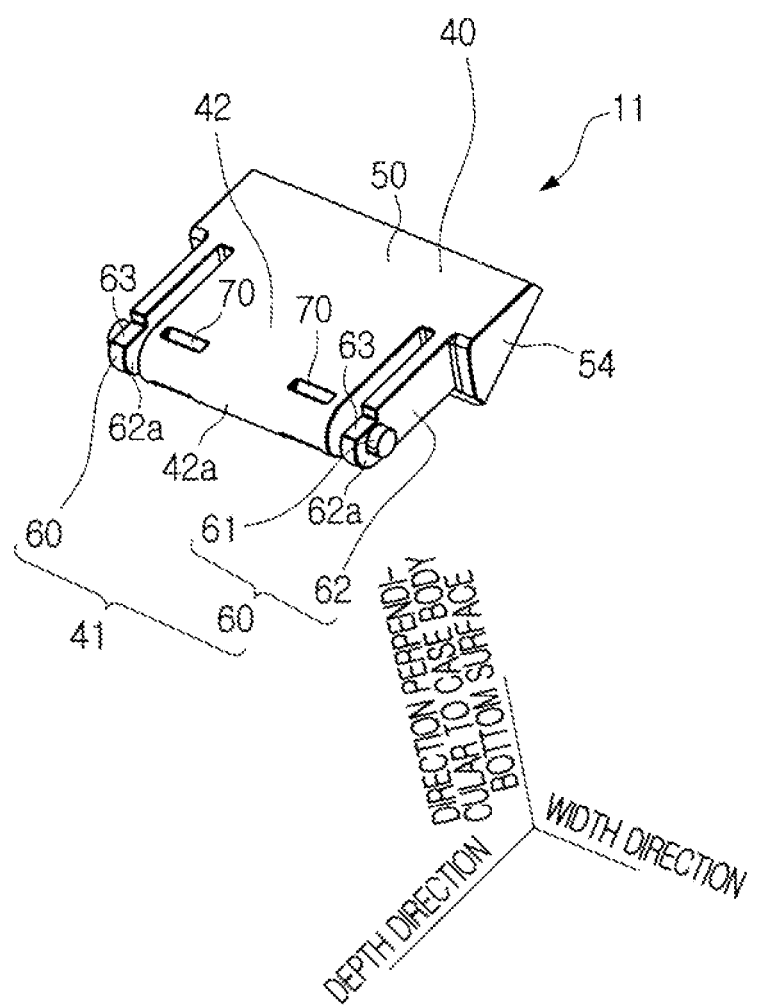
FIG. 9 is a perspective view of the lever seen from another angle (first embodiment)

As shown in FIGS. 8 through 11, the rotating mechanism 41 includes a pair of rotating units 60. Each of the rotating units 60 is connected to an end portion in the width direction of the lever main body 40, and is formed to protrude in the front direction in the sheltered state. Each of the rotating units 60 includes an axis portion 61 that is fitted into the foot 10, and an arm portion 62 connecting the axis portion 61 and the lever main body 40 to each other. The axis portion 61 is fitted into the bearing portion 24 formed in the side plate 14 of the foot 10 shown in FIG. 7. The arm portion 62 is connected to the end portion in the width direction of the lever main body 40, and is formed to protrude in the front direction in the sheltered state. The arm portion 62 is formed as a plate body that is perpendicular to the width direction. As shown in FIG. 9, the axis portion 61 is connected to a leading edge 62a of the arm portion 62, and protrudes in the leg body anti-center direction. In addition, a cut-out 63 is formed in the leading edge 62a. The cut-out 63 is formed at a side of the case body adjacent direction of the leading edge 62a of the arm portion 62, in the sheltered state. The cut-out 63 is located near the axis portion 61.

Figure 10:
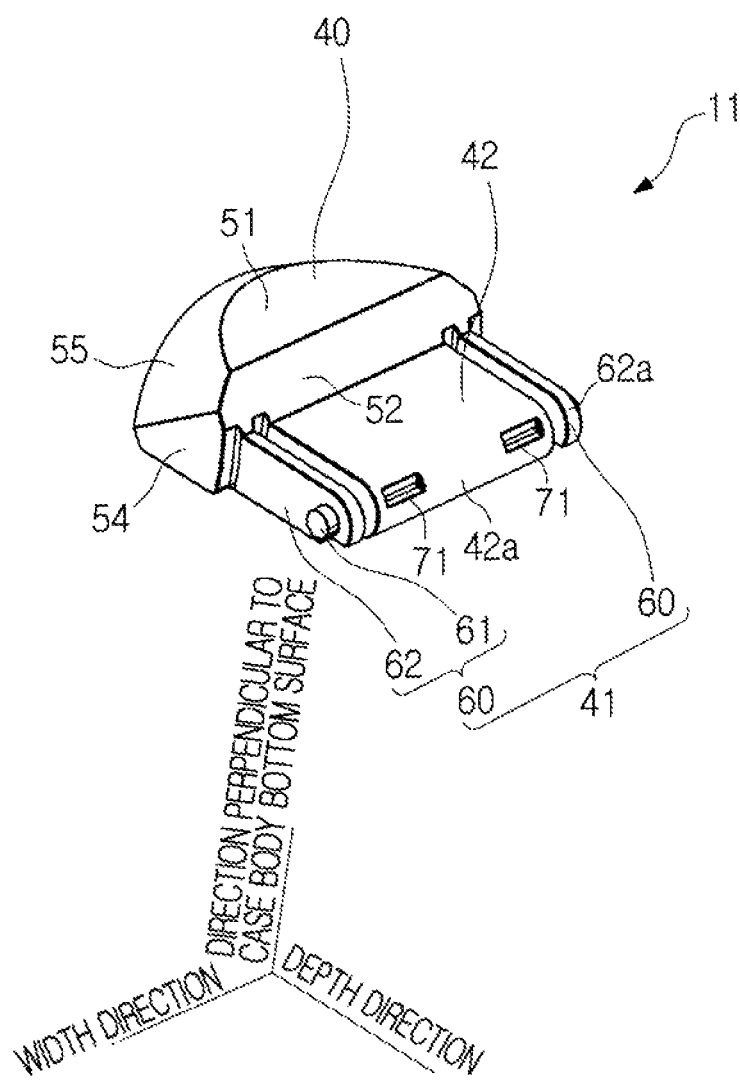
FIG. 10 is a perspective view of the lever seen from another angle (first embodiment)
Figure 11:
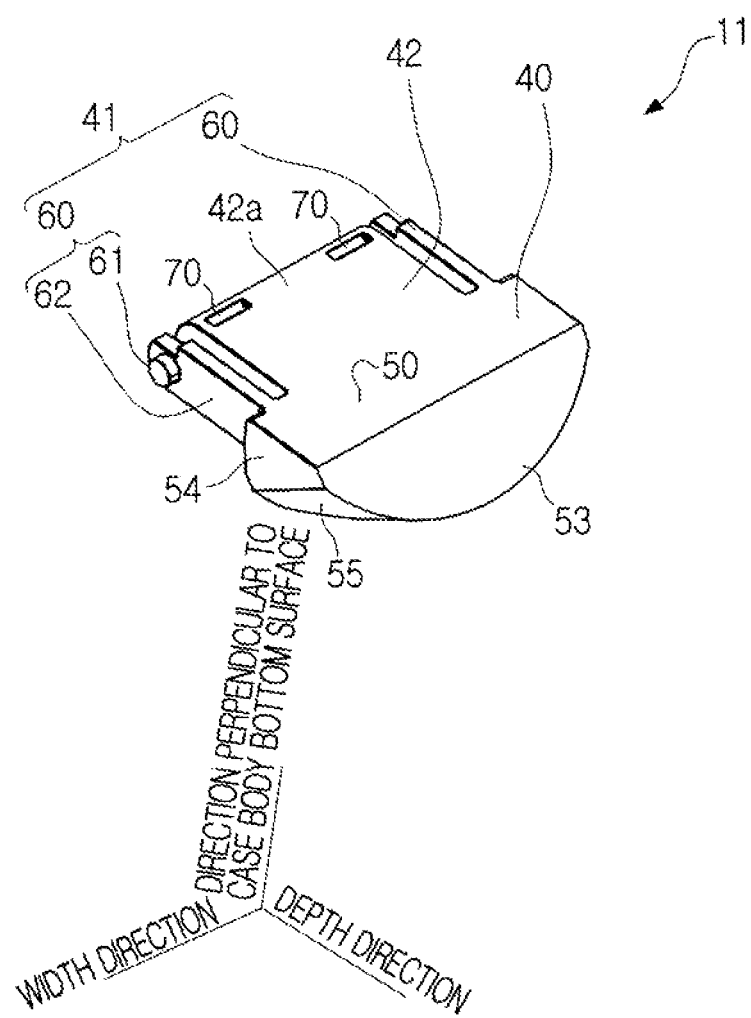
FIG. 11 is a perspective view of the lever seen from another angle (first embodiment)

The posture held portion 42 is connected to the end portion in the front direction of the lever main body 40 in the sheltered state, and is configured to protrude in the front direction. The posture held portion 42 is formed between the pair of rotating units 60. As shown in FIGS. 9 through 11, two sheltered state holding recesses 70 and two advanced state holding recesses 71 are formed in an end portion 42a in the front direction of the posture held portion 42. As shown in FIGS. 9 and 11, the two sheltered state holding recesses 70 are formed at a side of the case body adjacent direction of the end portion 42a of the posture held portion 42 in the sheltered state. The two sheltered state holding recesses 70 are opened toward the case body adjacent direction in the sheltered state. As shown in FIG. 10, the two advanced state holding recesses 71 are formed at a side of an intermediate direction between the front direction and the case body away direction on the end portion 42a of the posture held portion 42 in the sheltered state. The two advanced state holding recesses 71 are opened toward the intermediate direction between the front direction and the case body away direction of the end portion 42a of the posture held portion 42 in the sheltered state.

Assembling of the Adjustable Leg Body 8

Next, processes of assembling the adjustable leg body 8 will be described below.

First, as shown in FIG. 8, in a state where the arm portion 62 of each rotating unit 60 is extended in the depth direction and the axis portion 61 of each rotating unit 60 protrudes in the leg body anti-center direction, the rotating mechanism 41 and the posture held portion 42 of the lever 11 are inserted into the lever accommodation chamber 12 of the foot 10 shown in FIG. 6. Here, when the axis portion 61 shown in FIG. 8 contacts the guide recess 23 shown in FIG. 7, the axis portion 61 shown in FIG. 8 is dislocated toward the leg body center direction due to an elastic transformation of the arm portion 62. When the main body supporting surface of sheltered state 50 of the lever main body 40 shown in FIG. 12 contacts with the lever contact surface 13a of the ceiling plate 13 shown in FIG. 6, the axis portion 61 shown in FIG. 8 is fitted into the bearing portion 24 of FIG. 7. Here, as shown in FIG. 9, since the arm portion 62 has the cut-out 63, the first transformation prevention rib 17 shown in FIG. 7 does not physically interfere with the arm portion 62. Also, the claw portion 19 of each posture holding hook 16 shown in FIG. 7 is inserted into each of the sheltered state holding recesses 70 shown in FIG. 9. Accordingly, the lever 11 is maintained in the sheltered state with respect to the foot 10, as shown in FIGS. 2 and 3.

When attaching the adjustable leg body 8 to the bottom surface 3c of the case body 3, a male screw (not shown) is inserted into the screw hole 29 of the foot 10 shown in FIG. 6, and then, the male screw is inserted into a female screw that is formed in the bottom surface 3c of the case body 3. Accordingly, the foot attaching surface 10a of the foot 10 in the adjustable leg body 8 surface-contacts with the bottom surface 3c of the case body 3. In addition, the adjustable leg body 8 is attached to the bottom surface 3c of the case body 3 so that the lever main body 40 of the lever 11 may be located at further rear direction side from the front portion 15 of the foot 10. Accordingly, in the sheltered state shown in FIG. 3, the lever 11 is hidden behind the foot 10 when it is seen from the front portion of the electronic device 2, and thus, the electronic device 2 has a clear outer appearance.

Usage of the Adjustable Leg Body 8

FIG. 3 shows the sheltered state of the lever 11. In this state, when the electronic device 2 is mounted on the installation surface 1a of the universal rack 1, a weight of the case body 3 is applied to the installation surface 1a of the universal rack 1 via the bottom surface 3c of the case body 3, the foot attaching surface 10a of the foot 10 in the adjustable leg body 8, the leg body installation surface 26 of the front portion 15 of the foot 10, and the leg body installation surface 21 of each side plate 14 in the stated order.

In the state shown in FIG. 3, the front surface 3a of the case body 3 faces in a direction that is in parallel with the installation surface 1a of the universal rack 1. Therefore, according to a height of the installation surface 1a of the universal rack 1 from the ground, a user may want to adjust the manipulation panel 7 shown in FIG. 1 slightly upward. In this case, the user of the electronic device 2 manipulates the adjustable leg body 8 to change the posture of the case body 3 with respect to the installation surface 1a of the universal rack 1. In particular, after slightly lifting the front surface 3a side of the case body 3 of the electronic device 2, the lever 11 of the adjustable leg body 8 is rotated with respect to the foot 10 from the sheltered state shown in FIG. 3 to the advanced state shown in FIG. 5, and thus, the electronic device 2 is mounted on the installation surface 1a of the universal rack 1 as shown in FIG. 5. In the advanced state of FIG. 5, since the foot 10 is lifted high, the front surface 3a of the case body 3 faces slightly upward, and thus, an operation property of the manipulation panel 7 may be improved. Hereinafter, the change from the sheltered state shown in FIG. 3 to the advanced state shown in FIG. 5 will be described in detail below.

That is, in the sheltered state shown in FIG. 3, the user slightly lifts the front surface 3a side of the case body 3 of electronic device 2, and then, the user pulls down the lever main body 40 in the case body away direction by hooking a finger on the lever installation surface of advanced state 53 of the lever main body 40 of the lever 11 in the adjustable leg body 8. Then, the posture holding hook 16 shown in FIG. 7 is elastically dislocated in the case body adjacent direction so that the claw portion 19 exits the sheltered state holding recess 70 shown in FIG. 9 and the posture of the lever 11 held by the foot 10 is released. Subsequently, when the lever main body 40 is pulled down in the case body away direction, the lever 11 rotates on the axis portion 61 of each rotating unit 60. Finally, when the lever 11 rotates by about 122° with respect to the foot 10 and the main body supporting surface of advanced state 52 of the lever main body 40 shown in FIG. 12 collides with the leg body installation surface 26 of the front portion 15 of the foot 10 shown in FIG. 6, the main body supporting surface of advanced state 52 of the lever main body 40 surface-contacts the leg body installation surface 26 of the front portion 15 of the foot 10. At the same time, the claw portion 19 is inserted into the two advanced state holding recesses 71 shown in FIG. 10 while elastically transforming the elastic piece 18 of the posture holding hook 16 shown in FIG. 7. Accordingly, the posture of the lever 11 is tied by the foot 10, and thus, the lever 11 may not freely rotate with respect to the foot 10. That is, the advanced state of the lever 11 shown in FIG. 5 is maintained by the foot 10.

Here, the arm portion 62 of each rotating unit 60 shown in FIG. 8 is inserted into each of the second arm insertion recesses 31 shown in FIG. 7, and thus, the arm portion 62 is prohibited from being elastically transformed in the width direction. Likewise, the leading edge 62a of the arm portion 62 in the rotating unit 60 shown in FIG. 8 is inserted in each of the first arm insertion recesses 30 shown in FIG. 7. Even if unexpected external shock is applied to the lever 11 in the advanced state, the elastic transformation of the rotating mechanism 41 of the lever 11 is restricted by the first and second transformation prevention ribs 17 and 28. Accordingly, a possibility of damaging the rotating mechanism 41 of the lever 11 is reduced. Also, since the elastic transformation of the rotating mechanism 41 of the lever 11 is restricted, it is difficult for the lever 11 to fall out of the foot 10.

Also, as shown in FIG. 13, in the advanced state, at least a part of the lever installation surface of advanced state 53 is located in the virtual pillar body Q that uses the main body supporting surface of advanced state 52 as a bottom surface thereof and extends in a direction perpendicular to the main body supporting surface of advanced state 52. Therefore, a couple does not generate in the lever 11 in the advanced state shown in FIG. 5, and thus, the application of the weight of the case body 3 to the rotating mechanism 41 may be prevented. If the weight of the case body 3 is applied to the rotating mechanism 41, a bending stress generates in the rotating mechanism 41, and creep deformation occurs due to aged deterioration. Thus, in this case, the rotating mechanism 41 has to be formed of a metal material, not a resin material. In this point of view, according to the relation between the locations of the main body supporting surface of advanced state 52 and the lever installation surface of advanced state 53, the adjustable leg body 8 has no strength problems even when the entire adjustable leg body 8 is formed of a resin material, and accordingly, the adjustable leg body 8 may be manufactured at low manufacturing costs.

If the lever installation surface of advanced state 53 is not located in the virtual pillar body Q, a vector of the force applied to the lever main body 40 from the foot 10 and a vector of the force applied to the lever main body 40 from the installation surface 1a of the universal rack 1 may not be in a straight line, thereby generating the couple in the lever main body 40 (lever 11) due to physical principles.

Referring back to FIGS. 4 and 5, when the lever 11 is in the advanced state, the outer circumferential surface 10b of the foot 10 and the curved surface 55 of the lever main body 40 in the lever 11 forms the nearly same curved plane. Also, the lever installation surface of sheltered state 51 is located at a front surface side and seems to have an approximately semicircular shape. Therefore, the entire adjustable leg body 8 configures the same curved plane, and the user may identify that the lever 11 is in the advanced state with the naked eyes. Therefore, as shown in FIGS. 4 and 5, even if the lever 11 is seen from the front side of the electronic device 2, the design of the electronic device 2 is not ruined.

In the state shown in FIG. 5, if the user wants to change the posture of the case body 3, in which the front surface 3a of the case body 3 faces slightly upward, to a state in which the case body 3 is in parallel with the installation surface 1a of the universal rack 1 as shown in FIG. 3, the user of the electronic device 2 slightly lifts the front surface 3a side of the case body 3 of the electronic device 2, and then, pushes the lever main body 40 in the rear direction by hooking a finger in the lever installation surface of sheltered state 51 of the lever main body 40 of the lever 11 in the adjustable leg body 8. Then, in a manner opposite to the above description, the lever 11 is changed to the sheltered state from the advanced state. When the lever 11 is changed to the sheltered state, the electronic device 2 is placed on the installation surface 1a of the universal rack 1.

The first embodiment of the present invention is described above, and the above embodiment has following advantages:

(1) That is, the adjustable leg body 8 (installation posture adjustable leg body) for adjusting the installation posture of the case body 3 on the installation surface 1a is configured as follows: The adjustable leg body 8 includes the foot 10 (leg main body) fixed on the bottom surface 3c of the case body 3, and the lever 11 (movable unit) that is rotatably supported by the foot 10 so as to selectively change to one of the sheltered state, in which the foot 10 is located at the first location, and the advanced state, in which the foot 10 is located at the second location that is located at a higher level than that of the first location. The lever 11 includes the lever main body 40 (movable portion main body) that is inserted between the foot 10 and the installation surface 1a in the advanced state, and the rotating mechanism 41 for rotatably supporting the lever main body 40 with respect to the foot 10. The lever main body 40 includes the main body supporting surface of advanced state 52 (first support surface) contacting the foot 10 in the advanced state, and the lever installation surface of advanced state 53 (second support surface) contacting the installation surface 1a in the advanced state. At least a part of the lever installation surface of advanced state 53 is located in the virtual pillar body Q which uses the main body supporting surface of advanced state 52 as the bottom surface thereof and extends in the direction perpendicular to the main body supporting surface of advanced state 52. According to the above configuration, the couple does not generate in the lever main body 40 in the advanced state, and thus, the application of the weight of the case body 3 to the rotating mechanism 41 may be restricted and the adjustable leg body 8 is hardly damaged.

(2) In addition, the rotating mechanism 41 includes the axis portion 61 that is fitted into the foot 10, and the arm portion 62 connecting the axis portion 61 to the lever main body 40.

(3) The first arm insertion recess 30 and the second arm insertion recess 31 (arm portion insertion recess) into which the arm portions 62 are inserted in the advanced state, are formed in the foot 10. According to the above configuration, a transformation of the arm portion 62 may be restricted when some force is suddenly applied to the arm portion 62 due to movement of the case body 3 and the like, and accordingly, the possibility of damaging the arm portion 62 may be reduced.

(4) The foot 10 includes the outer circumferential surface 10b (curved surface). The lever main body 40 has the curved surface 55 forming the nearly same curved plane together with the outer circumferential surface 10b of the foot 10 in the advanced state. According to the above configuration, the adjustable leg body 8 has design consistency even in the advanced state.

(5) As shown in FIG. 5, the lever main body 40 is configured so that a gap g remains between the outer circumferential surface 10b of the foot 10 and the curved surface 55 of the lever main body 40 in the advanced state. As such, it is easy to rotate the lever 11 in order to separate the lever main body 40 from the foot 10.

(6) The electronic device 2 includes the case body 3, and the adjustable leg body 8 attached to the bottom surface 3c of the case body 3. In the advanced state, the outer circumferential surface 10b of the foot 10 and the curved surface 55 of the lever 11 both is located at the front side of the case body 3. Thus, the design consistency of the adjustable leg body 8 in the advanced state contributes to the outer appearance of the electronic device 2.

Second Embodiment

Next, a second embodiment of the present invention will be described with reference to FIGS. 14 through 17. Here, differences of the present embodiment from the first embodiment will be described, and repeated descriptions about the components described in the above embodiment are omitted. Also, like elements are denoted by like reference numerals.

Figure 14:
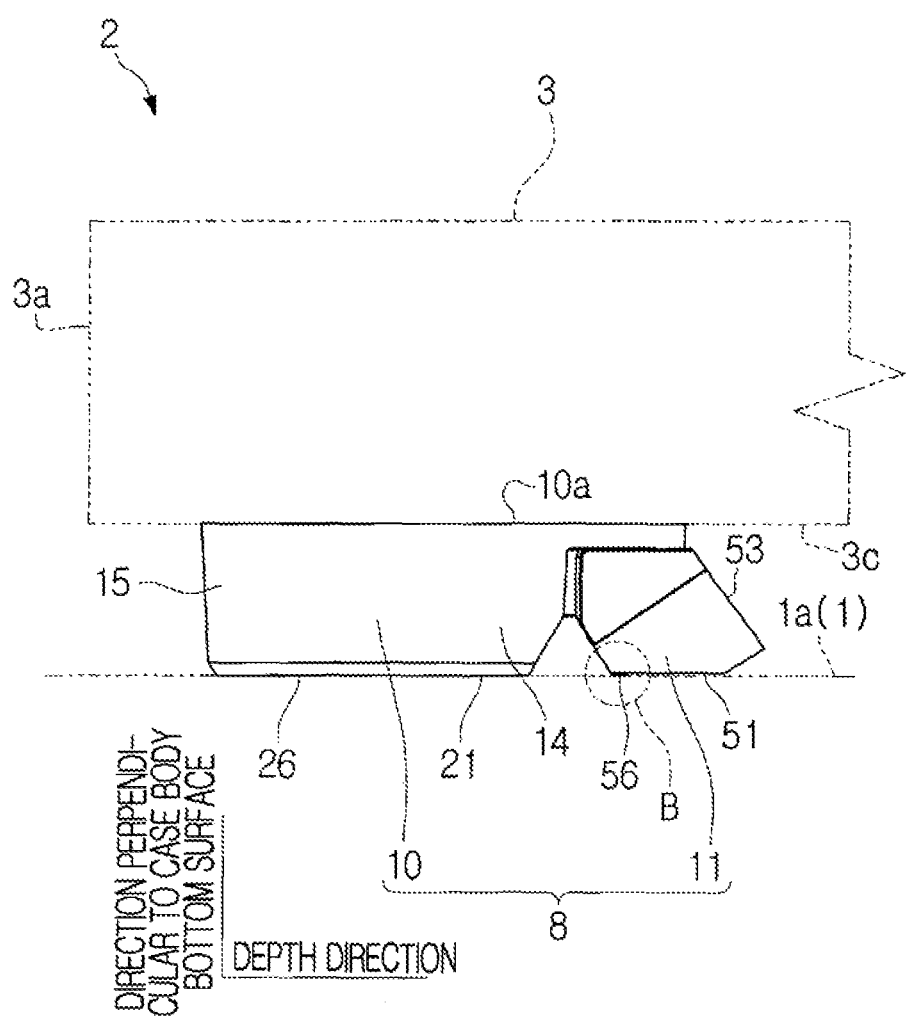
FIG. 14 is a side view of an adjustable leg body, a lever of which is in a sheltered state (second embodiment)
Figure 15:
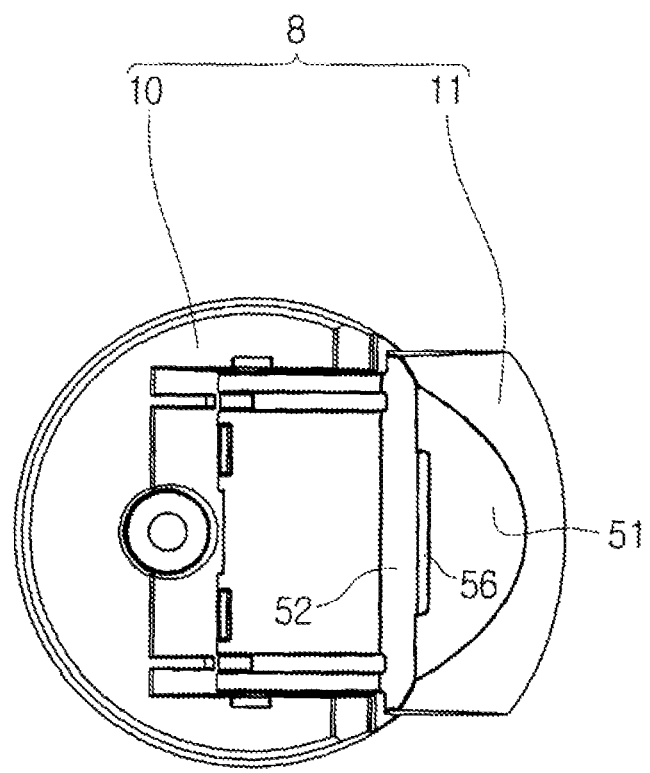
FIG. 15 is a bottom view of the adjustable leg body; the lever of which is in the sheltered state (second embodiment)
Figure 16:
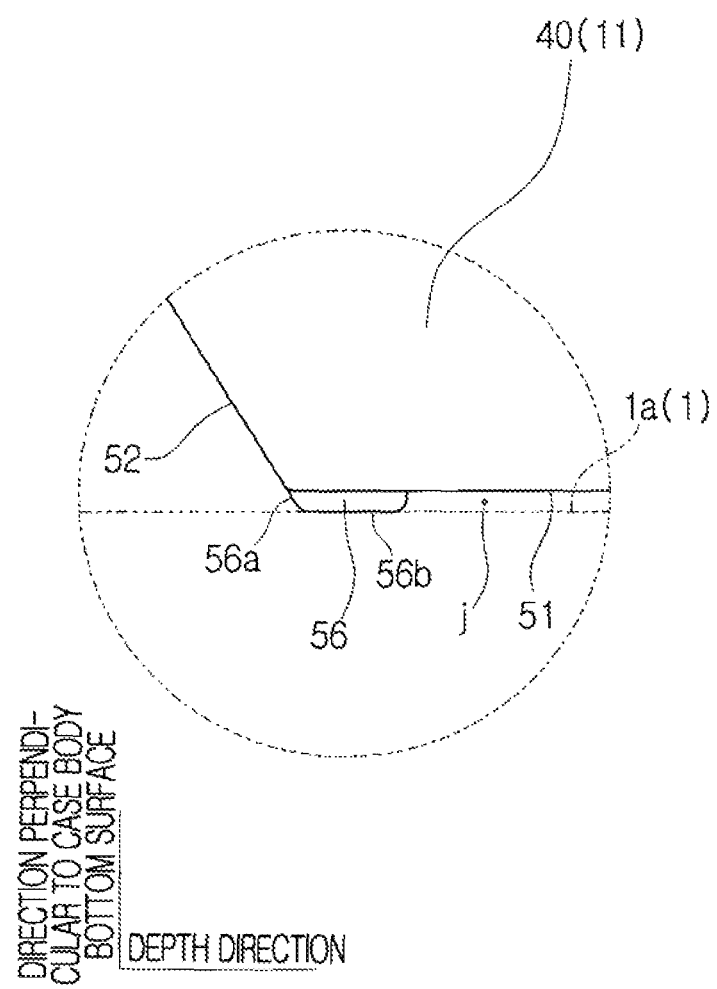
FIG. 16 is an enlarged view of a portion B shown in FIG. 14 (second embodiment)

As shown in FIGS. 14 through 17, a convex portion 56 is formed on the lever installation surface of sheltered state 51 according to the present embodiment. As shown in FIGS. 14 and 16, the convex portion 56 protrudes toward the installation surface 1*a* of the universal rack 1 in the sheltered state of the lever 11. Referring to FIG. 15, the convex portion 56 extends along the width direction. As shown in FIG. 16, the convex portion 56 includes a main body supporting surface of advanced state 56*a* (fourth support surface) and a lever installation surface of sheltered state 56*b*. The main body supporting surface of advanced state 56*a* is the same plane as the main body supporting surface of advanced state 52, and surface-contacts the foot 10 in the advanced state of the lever 11, like the main body supporting surface of advanced state 52. The lever installation surface of sheltered state 56*b* is a plane that surface-contacts the installation surface 1*a* of the universal rack 1 in the sheltered state of the lever 11.

As shown in FIG. 16, a gap j is formed between the lever installation surface of sheltered state 51 and the installation surface 1*a* of the universal rack 1 due to the convex portion 56 in the sheltered state of the lever 11, and thus, an installation trace such as a recess may not be formed in the lever installation surface of sheltered state 51 in the sheltered state of the lever 11. As shown in FIG. 4, the lever installation surface of sheltered state 51 is configured as a roughly semi-circular shape when the lever 11 is in the advanced state. Therefore, the convex portion 56 for leaving no an installation trace on the lever installation surface of sheltered state 51 largely contributes to the improvement of the outer appearance of the adjustable leg body 8, when, in particular, the lever 11 is in the advanced state.

Figure 17:
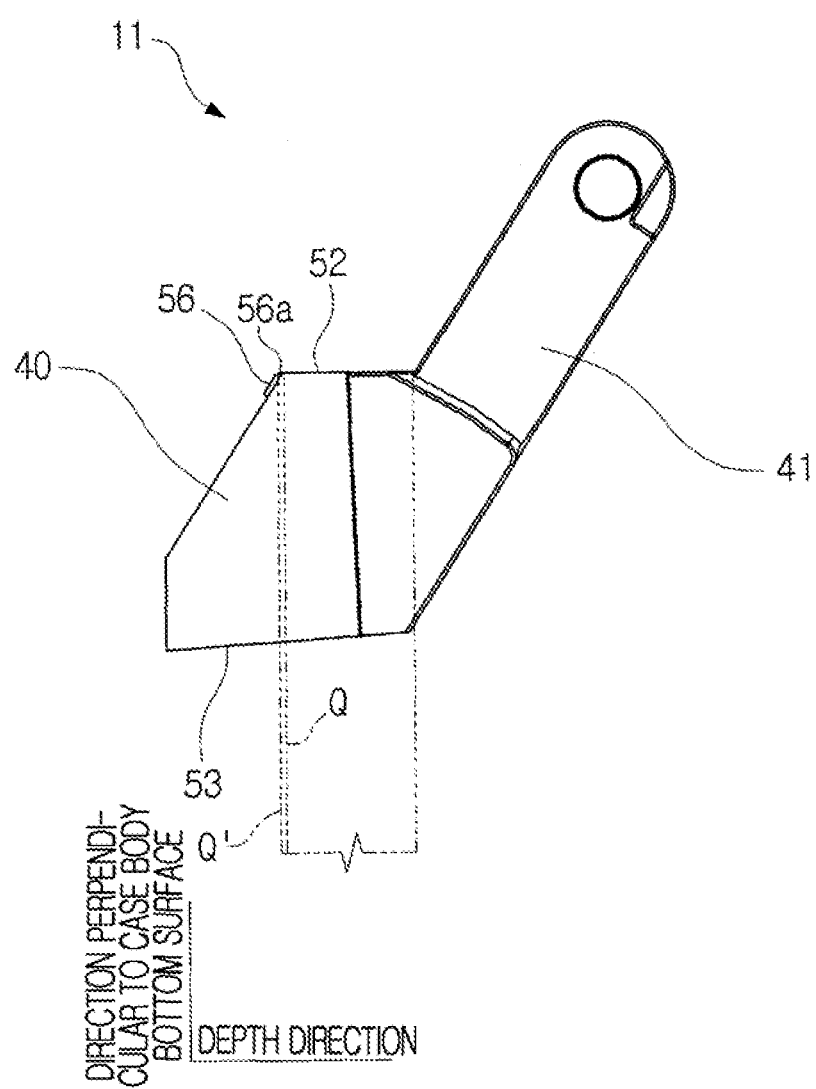
FIG. 17 is a side view of the lever in the advanced state (second embodiment).

Also, as shown in FIG. 16, the main body supporting surface of advanced state 56*a* of the convex portion 56 increases an area of the main body supporting surface of advanced state 52 of the lever main body 40 of the lever 11. Therefore, as shown in FIG. 17, a bottom surface area of a virtual pillar body Q' is greater than that of the virtual pillar body Q in the first embodiment, when the lever 11 is in the advanced state. Therefore, a degree of freedom in designing the lever main body 40 so as not to generate the couple in the lever main body 40 when the lever 11 is in the advanced state may be improved. Also, the lever main body 40 may support the foot 10 by a greater area, the strength of the lever main body 40 may be increased.

Also, the convex portion 56 is hidden in a shadow of the foot 10 when the lever 11 is in the advanced state as shown in FIG. 4, and thus, it is hard to see the convex portion 56. Therefore, even when the lever 11 is in the advanced state, the convex portion 56 does not degrade the outer appearance of the adjustable leg body 8.

As described above, the second embodiment of the present invention has the following advantages:

(7) The lever main body 40 (movable unit main body) includes the lever installation surface of sheltered state 51 (third support surface) facing the installation surface 1*a* of the universal rack 1 when the lever 11 is in the sheltered state. The lever installation surface of shelter state 51 includes the convex portion 56 protruding toward the installation surface 1*a* of the universal rack 1 when the lever 11 is in the sheltered state. According to the above configuration, the gap j is formed between the installation surface 1*a* of the universal rack 1 and the sheltered lever installation surface 51 when the lever 11 is in the sheltered state, and thus, a trace may not be formed on the lever installation surface of sheltered state 51 in the sheltered state of the lever 11. Therefore, when the lever installation surface of sheltered state 51 is visible from outside in the advanced state of the lever 11, the outer appearance of the adjustable leg body 8 is not degraded.

(8) The convex portion 56 has the main body supporting surface of advanced state 56*a* (fourth support surface) forming a same plane together with the main body supporting surface of advanced state 52 and contacting the foot 10 when the lever 11 is in the advanced state. According to the above configuration, since the bottom surface of the virtual pillar body Q' increases in area, the degree of freedom in designing the lever 11 in order not to generate the couple in the lever main body 40 when the lever 11 is in the advanced state may be improved. Also, since the lever main body 40 may support the foot 10 with the greater area, the strength of the lever main body 40 may be improved.

According to the present invention, it is hard for an installation posture adjustable leg body to be damaged.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. An installation posture adjustable leg body for adjusting an installation posture of a case body on an installation surface, the installation posture adjustable leg body comprising:
   a leg main body which is fixed on a bottom surface of the case body; and
   a movable unit which is rotatably supported by the leg main body so as to selectively move to one of a sheltered state, in which the leg main body is located at a first location, and an advanced state, in which the leg main body is located at a second location that is at a higher level than that of the first location,
   wherein the movable unit comprises:
   a movable unit main body which is inserted between the leg main body and the installation surface in the advanced state; and
   a rotating mechanism which rotatably supports the movable unit main body with respect to the leg main body,
   the movable unit main body comprises a first support surface contacting the leg main body in the advanced state, and a second support surface contacting the installation surface in the advanced state, wherein at least a part of the second support surface is located in a virtual pillar body which uses the first support surface as a bottom surface and extends in a direction perpendicular to the first support surface, and
   the rotating mechanism comprises:
   an axis portion which is fitted into the leg main body; and
   an arm portion which connects the axis portion to the movable unit main body.

2. The installation posture adjustable leg body of claim 1, wherein an arm portion insertion recess into which the arm portion is inserted in the advanced state is formed in the leg main body.

3. The adjustable leg body of claim 1, wherein the leg main body comprises a curved surface, and
   the movable unit main body comprises a curved surface that forms a nearly same curved plane together with the curved surface of the leg main body in the advanced state.

4. The installation posture adjustable leg body of claim 3, wherein the movable unit main body is configured so that a gap is formed between the curved surface of the leg main body and the curved surface of the movable unit main body in the advanced state.

5. An electronic device comprising:
- a case body; and
- the installation posture adjustable leg body of claim 3 attached to a bottom surface of the case body,
- wherein, in the advanced state, a curved surface of a leg main body and a curved surface of a movable unit main body are toward a direction which is from a rear surface side to a front surface side of the case body.

6. An installation posture adjustable leg body for adjusting an installation posture of a case body on an installation surface, the installation posture adjustable leg body comprising:
- a leg main body which is fixed on a bottom surface of the case body; and
- a movable unit which is rotatably supported by the leg main body so as to selectively move to one of a sheltered state, in which the leg main body is located at a first location, and an advanced state, in which the leg main body is located at a second location that is at a higher level than that of the first location,
- wherein the movable unit comprises:
- a movable unit main body which is inserted between the leg main body and the installation surface in the advanced state; and
- a rotating mechanism which rotatably supports the movable unit main body with respect to the leg main body,
- the movable unit main body comprises a first support surface contacting the leg main body in the advanced state, and a second support surface contacting the installation surface in the advanced state, wherein at least a part of the second support surface is located in a virtual pillar body which uses the first support surface as a bottom surface and extends in a direction perpendicular to the first support surface,
- the movable unit main body includes a third support surface facing the installation surface in the sheltered state, and
- the third support surface includes a convex portion protruding toward the installation surface in the sheltered state.

7. The installation posture adjustable leg body of claim 6, wherein the convex portion includes a fourth support surface forming a same plane together with the first support surface and contacting the leg main body in the advanced state.

\* \* \* \* \*